United States Patent
Hirooka et al.

[11] Patent Number: 6,144,595
[45] Date of Patent: Nov. 7, 2000

[54] SEMICONDUCTOR DEVICE PERFORMING TEST OPERATION UNDER PROPER CONDITIONS

[75] Inventors: Osamu Hirooka; Hiroyoshi Tomita; Tatsuya Kanda, all of Kawasaki, Japan

[73] Assignee: Fujitsu Limited, Kawasaki, Japan

[21] Appl. No.: 09/131,880

[22] Filed: Aug. 10, 1998

[30] Foreign Application Priority Data

Feb. 25, 1998 [JP] Japan .................................. 10-043994

[51] Int. Cl.[7] .................................................. G11C 7/00
[52] U.S. Cl. ........................................................ 365/201
[58] Field of Search .............................. 365/201, 189.05, 365/189.07, 189.08, 194, 230.08, 233

[56] References Cited

U.S. PATENT DOCUMENTS

| | | | |
|---|---|---|---|
| 5,375,096 | 12/1994 | Sugibayashi | 365/201 |
| 5,400,281 | 3/1995 | Morigami | 365/201 |
| 5,537,351 | 7/1996 | Suwa et al. | 365/201 |
| 5,563,830 | 10/1996 | Ishida | 365/201 |
| 5,654,924 | 8/1997 | Suzuki et al. | 365/201 |
| 5,724,366 | 3/1998 | Furutani | 365/201 |
| 5,961,657 | 10/1999 | Park et al. | 365/201 |
| 5,963,491 | 10/1999 | Arimoto | 365/201 |

*Primary Examiner*—Trong Phan
*Attorney, Agent, or Firm*—Arent Fox Kintner Plotkin & Kahn PLLC

[57] ABSTRACT

A semiconductor device outputs data from a plurality of data nodes during a normal-operation mode, and outputs a test result from at least one of the data nodes during a test-operation mode. The semiconductor device includes a plurality of data-bus lines which convey the data with respect to the data nodes, and a data-bus switch which allows only the data-bus lines corresponding to the at least one of the data nodes to be driven in a first condition of the test-operation mode, and which allows all of the data-bus lines corresponding to the data nodes to be driven in a second condition of the test-operation mode.

9 Claims, 8 Drawing Sheets

SEMICONDUCTOR DEVICE PERFORMING TEST OPERATION UNDER PROPER CONDITIONS

BACKGROUND OF THE INVENTION

1. Field of the Invention

The present invention generally relates to semiconductor devices, and particularly relates to a semiconductor device which is provided with a test-mode function to test operations of the semiconductor device.

2. Description of the Related Art

Semiconductor memory devices such as DRAMs are usually designed such that a data-output configuration (an output-interface configuration) thereof can be chosen from a 4-bit configuration, an 8-bit configuration, and a 16-bit configuration if a total of 16 data-output nodes are provided, for example. A selection and setting of a desired configuration can be made at the time of shipment from a factory by operating fuse wires.

When a 4-bit configuration is selected, for example, data is output only from 4 predetermined data-output nodes, and 12 remaining data-output nodes do not output data. In this case, one column-address access results in an output of 4-bit data. If an 8-bit configuration is selected, 8 predetermined data-output nodes are used for data output, and 4 other data-output nodes are not used. That is, 8-bit data is obtained when making a column-address access. In the case of a 16b-bit configuration, all of the 16 data-output nodes are used for data output, thereby providing 16-bit data upon a column-address access.

When a 64-Mega-bit semiconductor memory device is taken as an example, a selection of a 4-bit output configuration results in the number of possible consecutive accesses being 16 Mega in a direction of column addresses. That is, one data-output node can output 16-Mega bits of data consecutively. In the case of a 16-bit output configuration, the number of consecutively accessible data is 4 Mega in the column direction, so that one data-output node can output 4-Mega bits of data consecutively.

FIG. 1 is a circuit diagram showing a configuration of related-art data-bus switches which implement an output configuration as described above. In FIG. 1, the data-bus switches are shown only with respect to four data-output nodes DQ0 to DQ3 for the sake of explanation.

In FIG. 1, four data nodes DQ0 through DQ3 are provided to output data from a data buffer 600. For each piece of data which is output from a respective one of the data nodes DQ0 through DQ3, a corresponding one of data-bus switches 500-0 through 500-3 is provided. Namely, data supplied from the data-bus switch 500-1, for example, is output from the data node DQ1 via the data buffer 600.

The data-bus switch 500-0 includes inverters 501 through 504, data-transfer gates 505 through 507, and a NOR circuit 508. The data-bus switch 500-1 includes inverters 511 through 513, a data-transfer gate 514, and a NOR circuit 515. The data-bus switch 500-2 includes inverters 521 through 525 and data-transfer gates 526 through 530. The data-bus switch 500-3 includes inverters 531 through 533, a data-transfer gate 534, and a NOR circuit 535. Each transfer gate is comprised of a PMOS transistor and an NMOS transistor which are connected in parallel.

In the configuration of FIG. 1, all of the data nodes DQ0 through DQ3 are used for data-output purposes when a 16-bit-output configuration is selected (the same bus-switch configuration as that for DQ0 through DQ3 is provided for each of DQ4–DQ7, DQ8–DQ11, and DQ12–DQ15). In this case, the data nodes DQ0 through DQ3 output data dat00, dat11, dat22, and dat33, respectively.

In the case of an 8-bit-output configuration, only DQ0 and DQ2 are used among the data nodes DQ0 through DQ3 for the purpose of data output. The data nodes DQ0 and DQ2 in this case output data dat00 and dat22, respectively.

When a 4-bit configuration is selected, only DQ2 among the data nodes DQ0 through DQ3 is used for outputting data. The output data is data dat20 in this case.

Data datmn (m=1, 2, 3; n=1, 2, 3) represents an n-th bit of the parallel data supplied from memory cells with respect to a data node DQm. Data selection as to which bit is selected from the parallel data is made by signals gatemn (m=1, 2, 3; n=1, 2, 3). When a particular signal gatemn is HIGH, a corresponding data-transfer gate is opened, so that selected data is output from the data node DQm via a data bus DB and the data buffer 600.

Selection of an output configuration is made by selection signals dx4z and dx16z. When the selection signal dx4z is HIGH, the 4-bit-output configuration is chosen. When the selection signal dx16z is HIGH, the 16-bit-output configuration is selected. In other cases, the 8-bit-output configuration is selected.

In this manner, data is output from the data nodes DQ0 through DQ3 (in reality, from the data nodes DQ0 through DQ15).

Semiconductor devices, in general, are provided with a test-mode function to conduct a test on operations thereof, and test results are output from the data nodes DQ.

As described above, the data-output configuration is selected from and fixed to one of the 16-bit configuration, 8-bit configuration, and 4-bit configuration. Because of this, data nodes used for outputting test results should be the four data nodes which are used in the 4-bit configuration. If the data node DQ0, for example, is used for the purpose of outputting a test result in FIG. 1, the 16-bit configuration and the 8-bit configuration can send the test result to an exterior of the device without a problem, but the 4-bit configuration will fail to output the test result. That is, if the 4-bit configuration is selected and fixed, then, no access can be made to the test result form the exterior of the device. The configuration of FIG. 1, therefore, is such that a test result TSRST is output from the data node DQ2 via the data-bus switch 500-2.

During a test mode, a test-mode-indication signal testz is HIGH. This suspends data output from the data nodes DQ0, DQ1, and DQ3, which are not used during the test operation. Also, data as normally output from the data node DQ2 is suspended, and the test result TSRST is instead sent out via the data node DQ2. Suspension of unnecessary data output makes it possible to suppress electric-current consumption.

The configuration as described above normally allows a test to be properly conducted and a test result to be properly obtained. When the test result is susceptible to power-voltage noise caused by a fluctuation in an electric-current consumption inside the semiconductor device, for example, the above-described configuration may fail. Where the 16-bit-output configuration is selected and fixed, for example, the data bus DB is driven with respect to all the 16 bits of data during normal operations. Current consumption in this case is much larger than that of the 4-bit-output configuration. In the configuration of FIG. 1, the data bus DB is driven only with respect to 4 bits of data during the test operation since only 4 bits of data are output in the test mode. This means that current-consumption conditions as observed in the 16-bit-output configuration cannot be tested during the test mode.

DLL (delay-locked loop) circuits, provided for the purpose of timing adjustments of synchronization signals, are sensitive to a power-voltage fluctuation caused when current consumption fluctuates, so that such configuration as shown in FIG. 1 cannot allow a test on the DLL circuits to be properly conducted.

Accordingly, there is a need for a semiconductor device which can properly conduct a test on operations thereof under such current-consumption conditions as would be observed when additional data buses are driven in excess of a particular data bus necessary to be driven for outputting a test result.

SUMMARY OF THE INVENTION

Accordingly, it is a general object of the present invention to provide a semiconductor device which can satisfy the need described above.

It is another and more specific object of the present invention to provide a semiconductor device which can properly conduct a test on operations thereof under such current-consumption conditions as would be observed when additional data buses are driven in excess of a particular data bus necessary to be driven for outputting a test result.

In order to achieve the above objects according to the present invention, a semiconductor device which outputs data from a plurality of data nodes during a normal-operation mode, and outputs a test result from at least one of the data nodes during a test-operation mode includes a plurality of data-bus lines which convey the data with respect to the data nodes, and a data-bus switch which allows only the data-bus lines corresponding to the at least one of the data nodes to be driven in a first condition of the test-operation mode, and which allows all of the data-bus lines corresponding to the data nodes to be driven in a second condition of the test-operation mode.

In the semiconductor device described above, where data is output from a predetermined number of data nodes in the normal operation mode, all the data-bus lines corresponding to the predetermined number of data nodes inclusive of the data-bus line for outputting the test result are driven. This makes it possible to conduct a test under presence of a power-voltage fluctuation responsive to such current consumption as would be observed during the normal operation mode, thereby providing a proper test result.

According to one aspect of the present invention, the semiconductor device as described above is such that a number of the data nodes used for outputting the data varies depending on an output-interface configuration set to the semiconductor device.

In the semiconductor device described above, the output-interface configuration can be set to a 16-bit configuration, an 8-bit configuration, or a 4-bit configuration, for example, and the number of data nodes used for data output will be 16, 8, or 4, accordingly. The test result should be output by using one of the data nodes used in the 4-bit configuration. In the second condition of the test-operation mode, however, all the 16 bit-lines are driven if the 16-bit configuration is selected, for example.

According to another aspect of the present invention, the semiconductor device is such that the at least one of the data nodes outputs the test result, and the data nodes other than the at least one of the data nodes output the data in the second condition of the test-operation mode.

In the semiconductor device as described above, a test during the test-operation mode is conducted under such conditions as would be observed when the data is output during the normal-operation mode.

According to another aspect of the present invention, the semiconductor device described above further includes a memory-cell circuit, wherein the data output from the data nodes includes data stored in the memory-cell circuit.

In the semiconductor device as described above, the data is output via the data-bus lines from the memory cells in the second condition of the test operation mode, so that a test during the test-operation mode is conducted under such conditions as would be observed when the data is output during the normal-operation mode.

According to another aspect of the present invention, the semiconductor device as described above further includes a timing-stabilization circuit which stabilizes a timing of a synchronization signal, wherein the test result includes a result of a test conducted on the timing-stabilization circuit.

In the semiconductor device as described above, where the timing stabilization circuit susceptible to power-voltage fluctuation is provided, a test on the timing stabilization circuit is conducted under such power-voltage conditions as would be observed during the normal-operation mode.

According to another aspect of the present invention, the semiconductor device as described above is such that the timing-stabilization circuit includes a circuit which generates a lock-on signal when a timing of the synchronization signal is stabilized, and wherein the test result includes the lock-on signal.

In the semiconductor device described above, a test as to whether the timing-stabilization circuit has locked on or the like is conducted under such power-voltage conditions as would be observed during the normal-operation mode.

According to another aspect of the present invention, the semiconductor device as described above further includes a plurality of timing-stabilization circuits which stabilize timings of synchronization signals, wherein each of the plurality of the timing-stabilization circuits includes a circuit which generates a lock-on signal when a timing of a respective one of the synchronization signals is stabilized, the test result reflecting a status of the lock-on signal.

In the semiconductor device described above, a test as to whether the timing-stabilization circuit has locked on or the like is conducted under such power-voltage conditions as would be observed during the normal-operation mode even when more than one timing-stabilization circuits are provided.

Other objects and further features of the present invention will be apparent from the following detailed description when read in conjunction with the accompanying drawings.

DESCRIPTION OF THE PREFERRED EMBODIMENTS

In the following, an embodiment of the present invention will be described with reference to the accompanying drawings.

Figure 2:
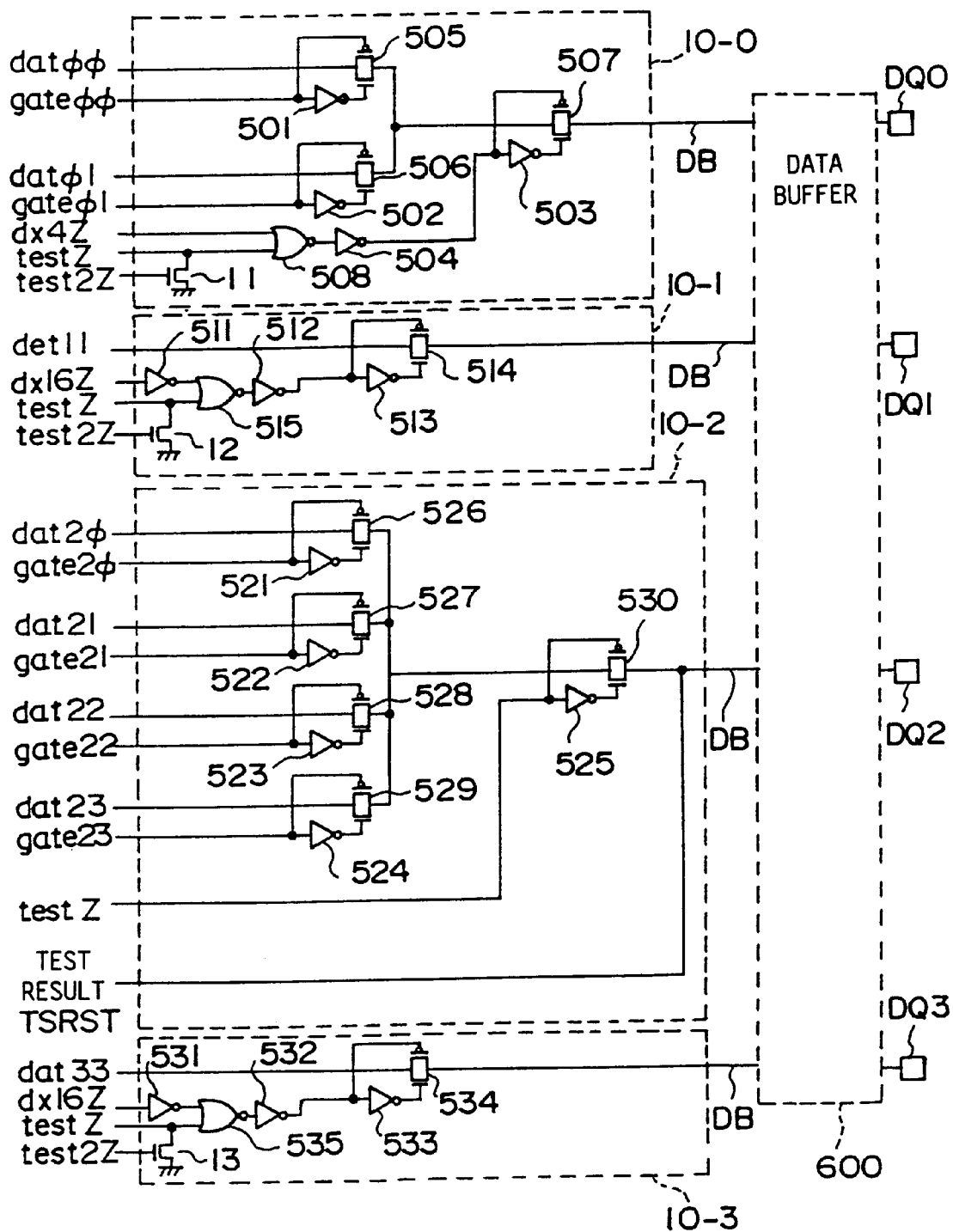
FIG. 2 is a circuit diagram showing a configuration of data-bus switches according to the present invention.

FIG. 2 is a circuit diagram showing a configuration of data-bus switches according to the present invention. FIG. 2 shows data-bus switches only with respect to four data nodes DQ0 through DQ3.

Figure 1:
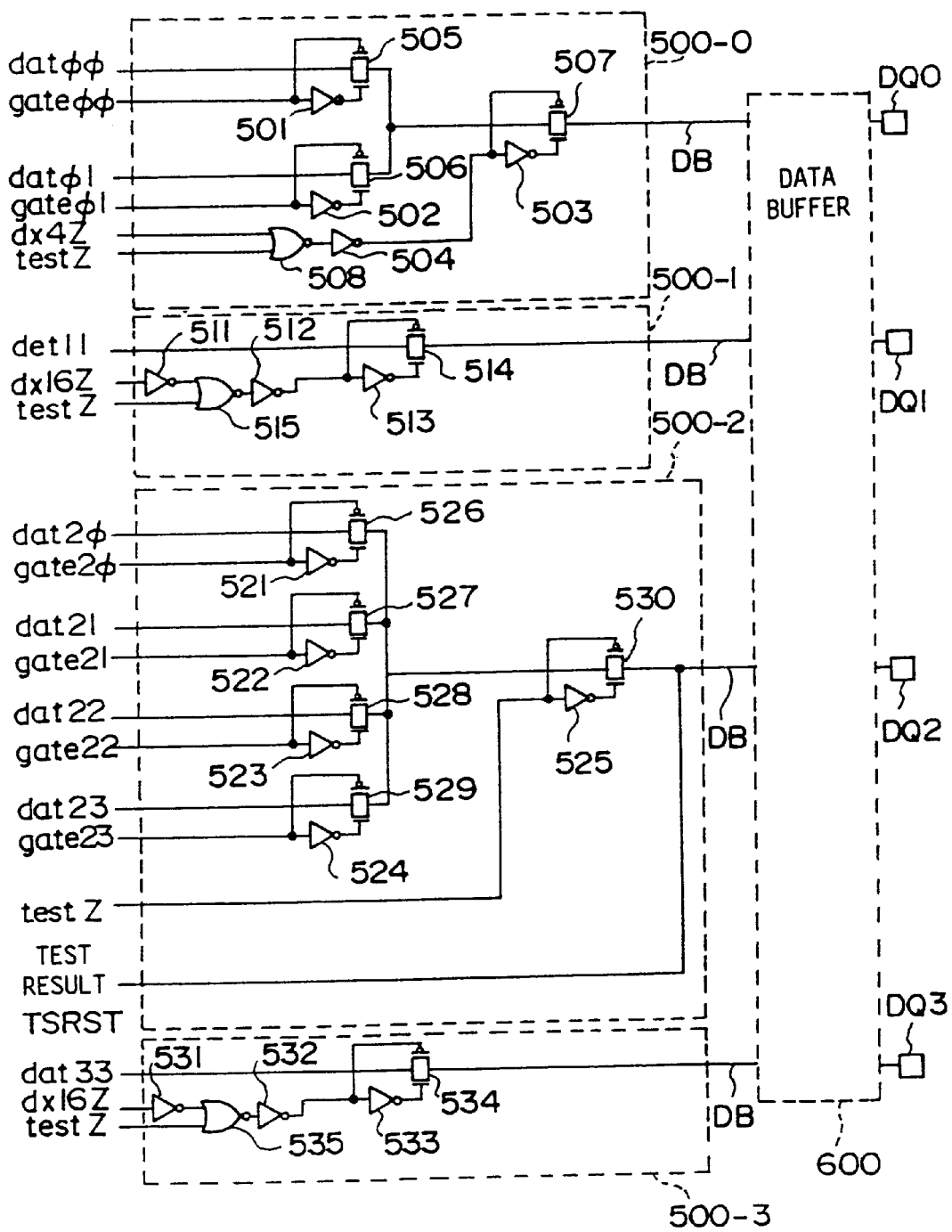
FIG. 1 is a circuit diagram showing a configuration of related-art data-bus switches which enable a selected output-interface configuration to be used.

The number of the data nodes is shown as four for the sake of explanation, but can be any number as may be appropriate. Where 16 output nodes DQ0 through DQ15 are provided, for example, the same configuration as that for DQ0–DQ3 as shown in FIG. 2 is provided for each of DQ4–DQ7, DQ8–DQ11, and DQ12–DQ15. In FIG. 2, the same elements as those of FIG. 1 are referred to by the same numerals, and a description thereof will be omitted.

In FIG. 2, a data-bus switch 10-0 includes an NMOS transistor 11, the inverters 501 through 504, the data-transfer gates 505 through 507, and the NOR circuit 508. A data-bus switch 10-1 includes an NMOS transistor 12, the inverters 511 through 513, the data-transfer gate 514, and the NOR circuit 515. A data-bus switch 10-2 includes the inverters 521 through 525 and the data-transfer gates 526 through 530. A data-bus switch 10-3 includes an NMOS transistor 13, the inverters 531 through 533, the data-transfer gate 534, and the NOR circuit 535. Each transfer gate is comprised of a PMOS transistor and an NMOS transistor which are connected in parallel.

In the configuration of FIG. 2, all of the data nodes DQ0 through DQ3 are used for data-output purposes when a 16-bit-output configuration is selected. In this case, the data nodes DQ0 through DQ3 output data dat00, dat11, dat22, and dat33, respectively. In the case of an 8-bit-output configuration, only DQ0 and DQ2 are used among the data nodes DQ0 through DQ3 for the purpose of data output. The data nodes DQ0 and DQ2 in this case output data dat00 and dat22, respectively. When a 4-bit configuration is selected, only DQ2 among the data nodes DQ0 through DQ3 is used for outputting data. The output data is data dat20 in this case.

Data datmn (m=1, 2, 3; n=1, 2, 3) represents an n-th bit of the parallel data supplied from memory cells with respect to a data node DQm. Data selection as to which bit is selected from the parallel data is made by signals gatemn (m=1, 2, 3; n=1, 2, 3). When a particular signal gatemn is HIGH, a corresponding data-transfer gate is opened, so that selected data is output from the data node DQm via a data bus DB and the data buffer 600.

Selection of an output configuration is made by selection signals dx4z and dx16z. When the selection signal dx4z is HIGH, the 4-bit-output configuration is chosen. When the selection signal dx16z is HIGH, the 16-bit-output configuration is selected. In a case where the signals dx4z ad dx16z are LOW, the 8-bit-output configuration is selected.

In this manner, data is output from the data nodes DQ0 through DQ3 (i.e., from the data nodes DQ0 through DQ15 in the case of 16 data nodes).

During a test mode, a test-mode-indication signal testz is HIGH, thereby closing the data-transfer gates 507, 514, and 534. Data output is thus suspended with respect to the data nodes DQ0, DQ1, and DQ3, which are not necessary during the test operation. Also, the data-transfer gate 530 is closed so as to suspend data as normally output from the data node DQ2. In place of this data, a test result TSRST is sent out via the data node DQ2.

In the present invention, an bus-active-test-mode-indication signal test2z is supplied to the data-bus switches. The bus-active-test-mode-indication signal test2z becomes HIGH when an operation test needs to be conducted by keeping other data buses DB driven in addition to the data bus DB for outputting the test result TSRST.

When the bus-active-test-mode-indication signal test2z is changed to HIGH, the NMOS transistor 11 of the data-bus switch 10-0, the NMOS transistor 12 of the data-bus switch 10-1, and the NMOS transistor 13 of the data-bus switch 10-3 are turned on. This connects the test-mode-indication signal testz to a ground voltage (LOW voltage), so that the test-mode-indication signal testz is invalidated in the data-bus switches 10-0, 10-1, and 10-3.

Accordingly, the present invention can perform a test as would be conduced in the related art by changing th test-mode-indication signal testz to HIGH. Further, the present invention can perform a test under such conditions as other data buses DB are driven in addition to the data bus DB for outputting the test result TSRST. This is achieved by making the test-mode-indication signal testz and the bus-active-test-mode-indication signal test2z HIGH at the same time.

In this manner, even when the test result TSRST is affected by power-voltage noise following a fluctuation in electric-current consumption, the same number of data buses DB as used in the selected output configuration during the normal operation are driven in the test operation, thereby allowing a test to be conducted under the same conditions as the current-consumption conditions of the normal operation. This insures that a proper test result TSRST is obtained. When the 16-bit-output configuration is selected and fixed, for example, a test can be performed while driving the data buses DB for all of the 16 bits. Where the 8-bit-output configuration is selected and fixed, a test can be conducted while driving the data buses DB with respect to 8 appropriate bits. Since timing-stabilization circuits such as DLL circuits for adjusting timings of synchronization signals are susceptible to power-voltage fluctuation caused by varying current consumption, use of the data-bus switches of the present invention is valuable in that a proper test on DLL circuits or the like can be conducted.

Figure 3:
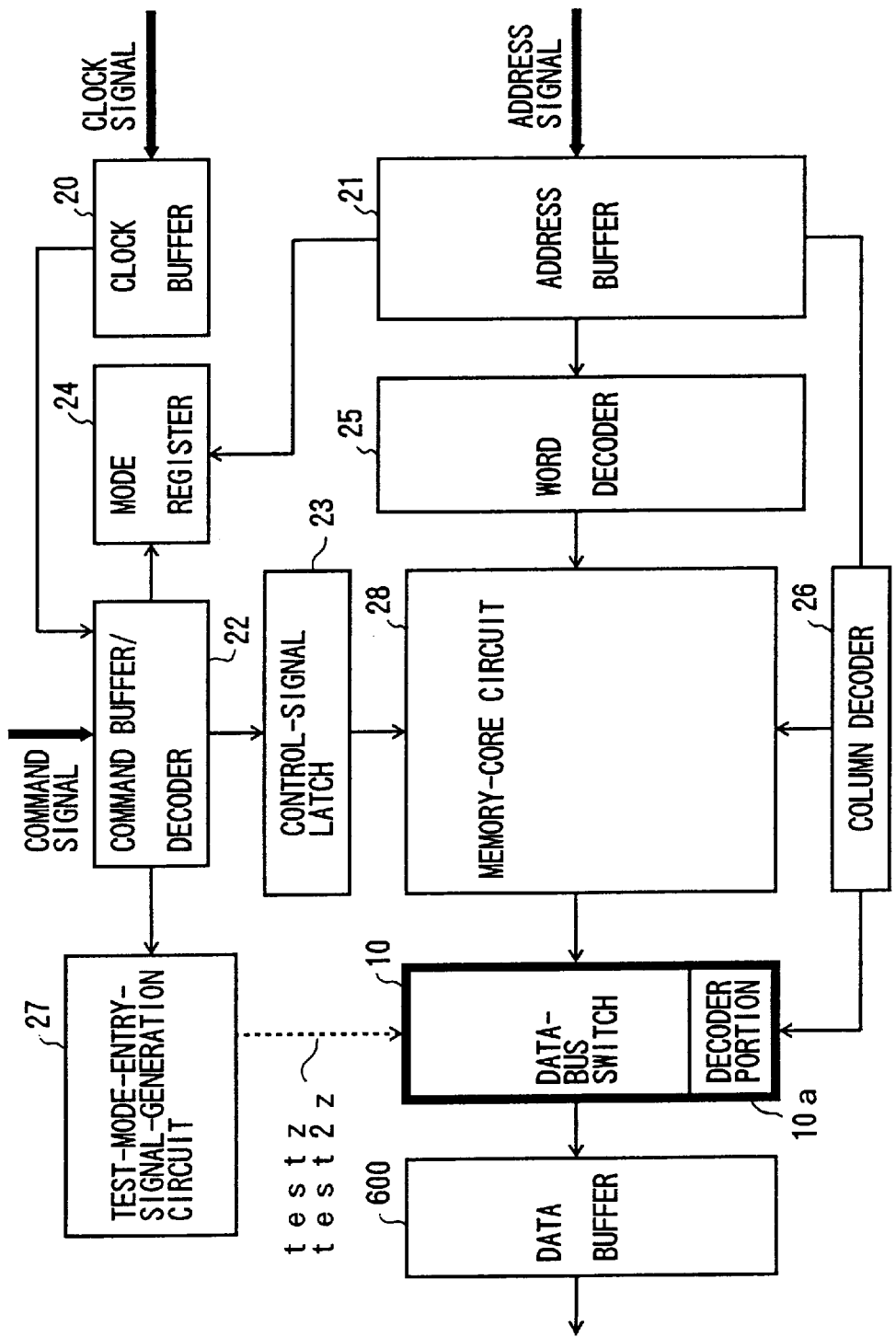
FIG. 3 is a block diagram showing a configuration of a semiconductor memory device to which the data-bus switches of the present invention are applied.

FIG. 3 is a block diagram showing a configuration of a semiconductor memory device to which the data-bus switches of the present invention are applied.

The semiconductor memory device of FIG. 3 includes a clock buffer 20, an address buffer 21, a command buffer/decoder 22, a control-signal latch 23, a mode register 24, a word decoder 25, a column decoder 26, a test-mode-entry-signal-generation circuit 27, a memory-core circuit 28, a data-bus switch 10, and a data buffer 600.

The clock buffer 20 receives a clock signal CLK, and supplies it as an input/output-synchronization signal to the command buffer/decoder 22, the address buffer 21, and the data buffer 600. The clock buffer 20 further supplies synchronization signals to internal circuits for the purpose of controlling operation timings thereof.

The command buffer/decoder 22 receives control signals such as /CS (chip select), /RAS (row address strobe), /CAS (column address strobe), and /WE (write enable), and decodes the received control signals. The command buffer/ decoder 22 supplies decoding results of the control signals to the control-signal latch 23 and the mode register 24. The control-signal latch 23 latches the decoding results supplied from the command buffer/decoder 22. The latched decoding results are used for controlling operations of the memory-core circuit 28.

The address buffer 21 receives address signals, and supplies address data to the mode register 24, the word decoder 25, and column decoder 26.

The mode register 24 generally stores parameters such as a CAS latency and a burst length. An instruction to store parameters in the register is given by the control signals, and the contents of parameters are specified by the address data.

The word decoder 25 accesses data of a row of memory cells when the row is indicated by a supplied row address. The accessed data is read to sense amplifiers in the memory-core circuit 28. The column decoder 26 supplies data from the sense amplifiers to the data buffer 600 via the data-bus switch 10 when the data is selected by a supplied column address. The data buffer 600 outputs the supplied data to the exterior of the device.

The test-mode-entry-signal-generation circuit 27 checks whether a current operation mode is a test-operation mode or a normal operation mode based on the decoding results or the like supplied from the command buffer/decoder 22. If the test-operation mode is indicated, the test-mode-entry-signal-generation circuit 27 changes the test-mode-indication signal testz to HIGH. Also, if there is a need to conduct a test while driving the same number of data buses as driven during the normal operation mode, the test-mode-indication signal testz is changed to HIGH along with the test-mode-indication signal testz.

The bus-active-test-mode-indication signal test2z may be generated during the test-operation mode by inputting a Read command as a command signal. Namely, the command buffer/decoder 22 supplies a decoding result in response to the Read-command input, and the test-mode-entry-signal-generation circuit 27, responding to the decoding result, generates the bus-active-test-mode-indication signal test2z.

Alternately, selection of a test type as to whether to drive the data buses may be made by decoding address data. In this case, a configuration is such that the address buffer 21 supplies address data to the test-mode-entry-signal-generation circuit 27. A decoder which selects a test-operation mode and a test type is a typical decoder within the scope of ordinary skill in the art, and a description of such a configuration will be omitted.

The data-bus switch 10 includes the data-bus switches 10-1 through 10-3 shown in FIG. 2. Where the semiconductor memory device of FIG. 3 is provided with 16 data-output nodes, for example, the data-bus switch 10 includes data-bus switch 10-0 through 10-15.

The data-bus switch 10 receives the test-mode-indication signal testz and the bus-active-test-mode-indication signal test2z from the test-mode-entry-signal-generation circuit 27, and operates as described in connection with FIG. 2. The data-bus switch 10 includes a decoder portion 10a, which receives a column address from the column decoder 26, and decodes the received column address. The signals gatemn as previously described are generated. The configuration of the decoder portion is conventional as may be widely used in the art.

Figure 4:
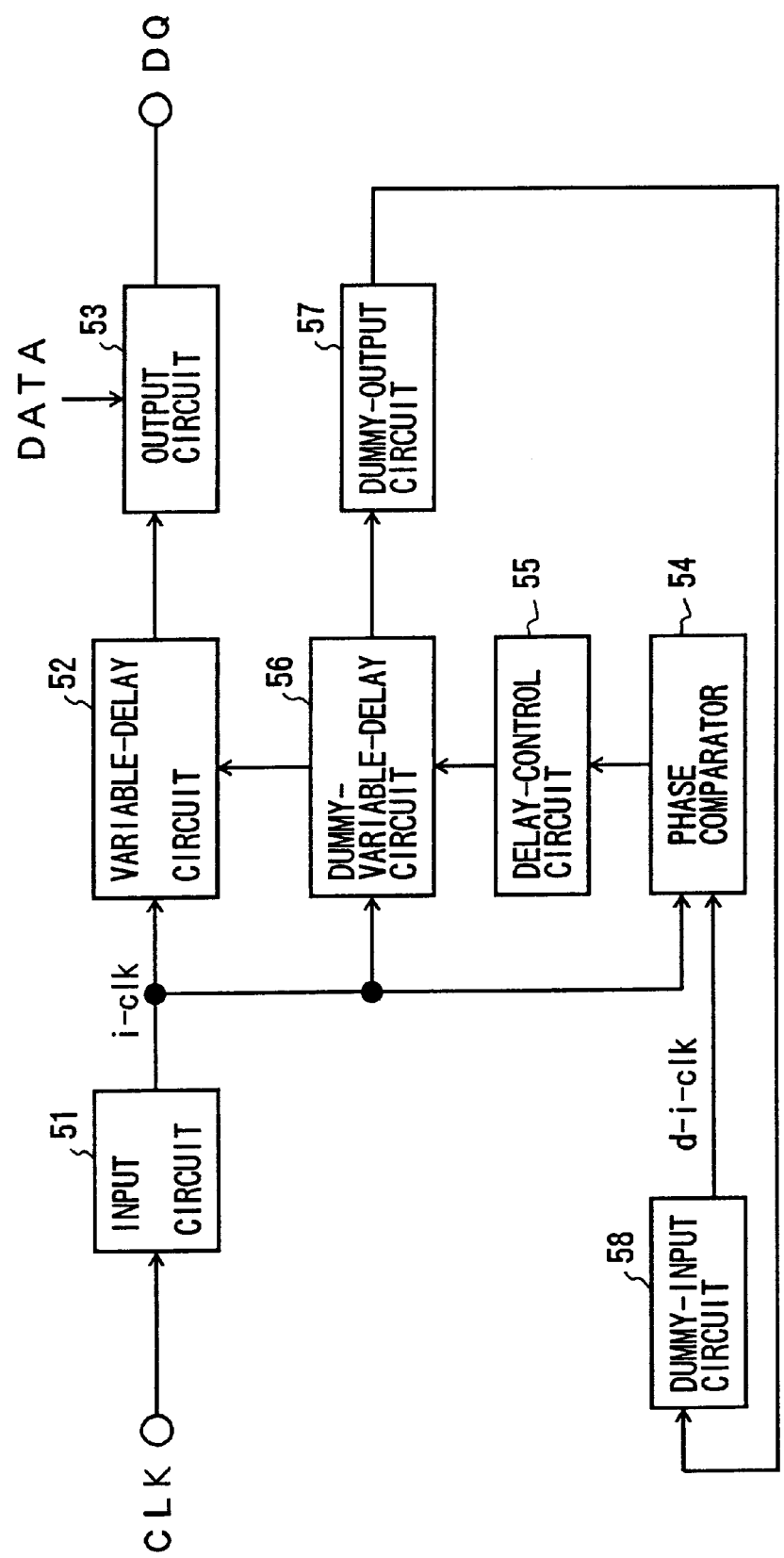
FIG. 4 is a block diagram of a circuit which adjusts a data-output timing by using a DLL circuit serving as a timing stabilization circuit.

FIG. 4 is a block diagram of a circuit which adjusts a data-output timing by using a DLL circuit serving as a timing stabilization circuit.

The circuit of FIG. 4 includes an input circuit 51, a variable-delay circuit 52, an output circuit 53, a phase comparator 54, a delay-control circuit 55, a dummy-variable-delay circuit 56, a dummy-output circuit 57, and a dummy-input circuit 58.

A clock signal CLK input to the input circuit 51 is compared with a reference voltage level, and is output from the input circuit 51 as a clock signal i-clk. The clock signal i-clk is then delayed by the variable-delay circuit 52 by an appropriate delay amount, and is supplied to the output circuit 53. The output circuit 53 uses the supplied internal-clock signal as a synchronization signal for latching data DATA which is to be output from the device. The latched data DATA is then supplied from the output circuit 53 to an exterior of the semiconductor device as data DQ.

The signal path from an input node of the clock signal CLK to the output circuit 53 inevitably introduces a delay which is inherent to the circuit, so that the data DQ output to the exterior of the device has a timing displacement relative to the clock signal CLK. In order to ensure that the data DQ output from the output circuit 53 is adjusted to have a predetermined timing relation with the externally provided clock signal CLK, a DLL circuit mainly comprised of the phase comparator 54, the delay-control circuit 55, and the dummy-variable-delay circuit 56 is employed.

The clock signal i-clk is supplied to the dummy-variable-delay circuit 56. The dummy-variable-delay circuit 56 is controlled to delay the clock signal i-clk by the same delay amount as that applied by the variable-delay circuit 52. The delayed-clock signal output from the dummy-variable-delay circuit 56 is then supplied to the dummy-output circuit 57, which emulates the output circuit 53. The clock signal output from the dummy-output circuit 57 is supplied as a dummy-clock signal d-i-clk to the phase comparator 54 via the dummy-input circuit 58, which has the same delay characteristics as the input circuit 51.

The phase comparator 54 makes a comparison of the clock signal i-clk with the dummy-clock signal d-i-clk in terms of their phases. To ensure that both clock signals have the same phase, the phase comparator 54 controls the delay amount of the dummy-variable-delay circuit 56 via the delay-control circuit 55. In this manner, the clock signal output from the dummy-output circuit 57 is adjusted so as to have a predetermined timing relation with the input clock signal CLK.

A total delay of the variable-delay circuit 52 and the output circuit 53 is equal to a total delay of the dummy-variable-delay circuit 56 and the dummy-output circuit 57. Because of this, when the clock signal output from the dummy-output circuit 57 has the predetermined timing relation with the input clock signal CLK, the data DQ output from the output circuit 53 to the exterior of the device ends up having the same predetermined timing relation with the input clock signal CLK.

In this configuration, even when the characteristics of the input circuit 51, the variable-delay circuit 52, and the output circuit 53 are changed due to variations in a power voltage and/or temperature, the characteristics of the dummy-input circuit 58, the dummy-variable-delay circuit 56, and the dummy-output circuit 57 also change in the same manner. Because of this, the data DQ output from the output circuit 53 to the exterior of the device always keeps the same timing relation with the input clock signal CLK regardless of a power-voltage variation and/or a temperature variation.

Figure 5:
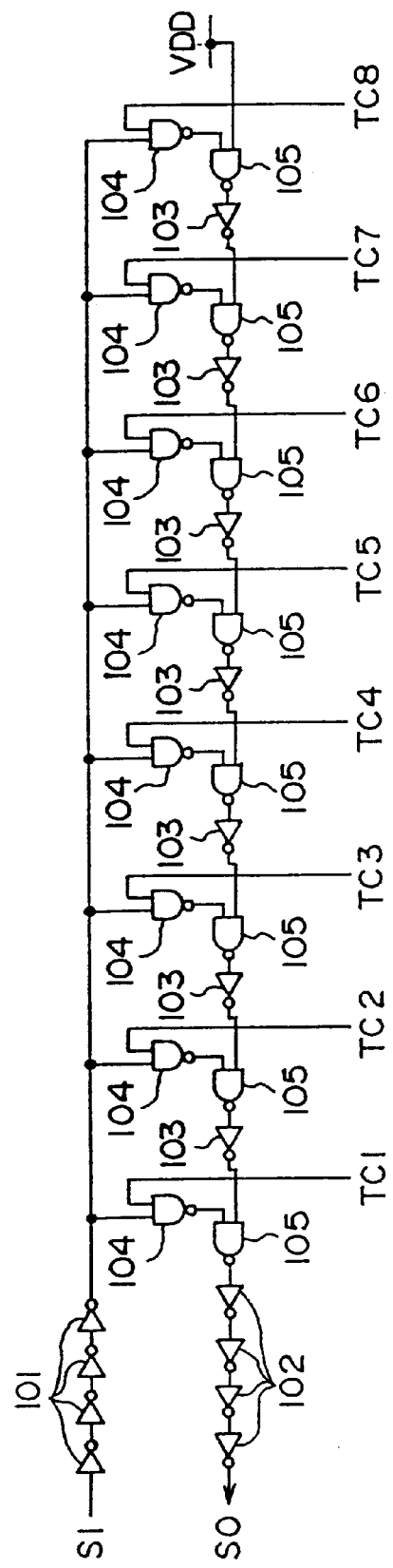
FIG. 5 is a circuit diagram showing a circuit structure of a variable-delay circuit.

FIG. 5 is a circuit diagram showing a circuit structure of a variable-delay circuit. The variable-delay circuit 52 and the dummy-variable-delay circuit 56 shown in FIG. 4 have an identical circuit structure as illustrated in FIG. 5.

The variable-delay circuit of FIG. 5 includes a plurality of inverters 101, a plurality of inverters 102, a plurality of inverters 103, a plurality of NAND circuits 104, and a plurality of NAND circuits 105. A given one of the inverters 103 and a corresponding one of the NAND circuits 105 together form one stage of a delay element, such that the plurality of inverters 103 and the plurality of NAND circuits 105 together form a series of delay elements having a plurality of delay stages. Control signals TC1 through TC8 are supplied to the NAND circuits 104, and are provided from the delay-control circuit 55. A detailed description of the control signals TC1 through TC8 will be provided later. For the understanding of the circuit operations of FIG. 5, it should be pointed out that only two adjacent signals are HIGH among the control signals TC1 through TC8, and the remaining control signals are LOW.

An input signal S1 is supplied to the plurality of NAND circuits 104 via the plurality of inverters 101. The input signal S1 passes through a given one of the NAND circuits 104 when this NAND circuit 104 receives a HIGH signal as one of the control signals TC1 through TC8, and enters the series of delay elements comprised of the plurality of inverters 103 and the plurality of NAND circuits 105. The input signal SI propagates through the series of delay elements, and is output as an output signal SO after passing through the plurality of inverters 102. Depending on a position of the two adjacent signals which are HIGH among the control signals TC1 through TC8, the input signal SI passes through a different number of delay stages. Control of this position makes it possible to adjust how much the input signal SI is delayed.

Figure 6:
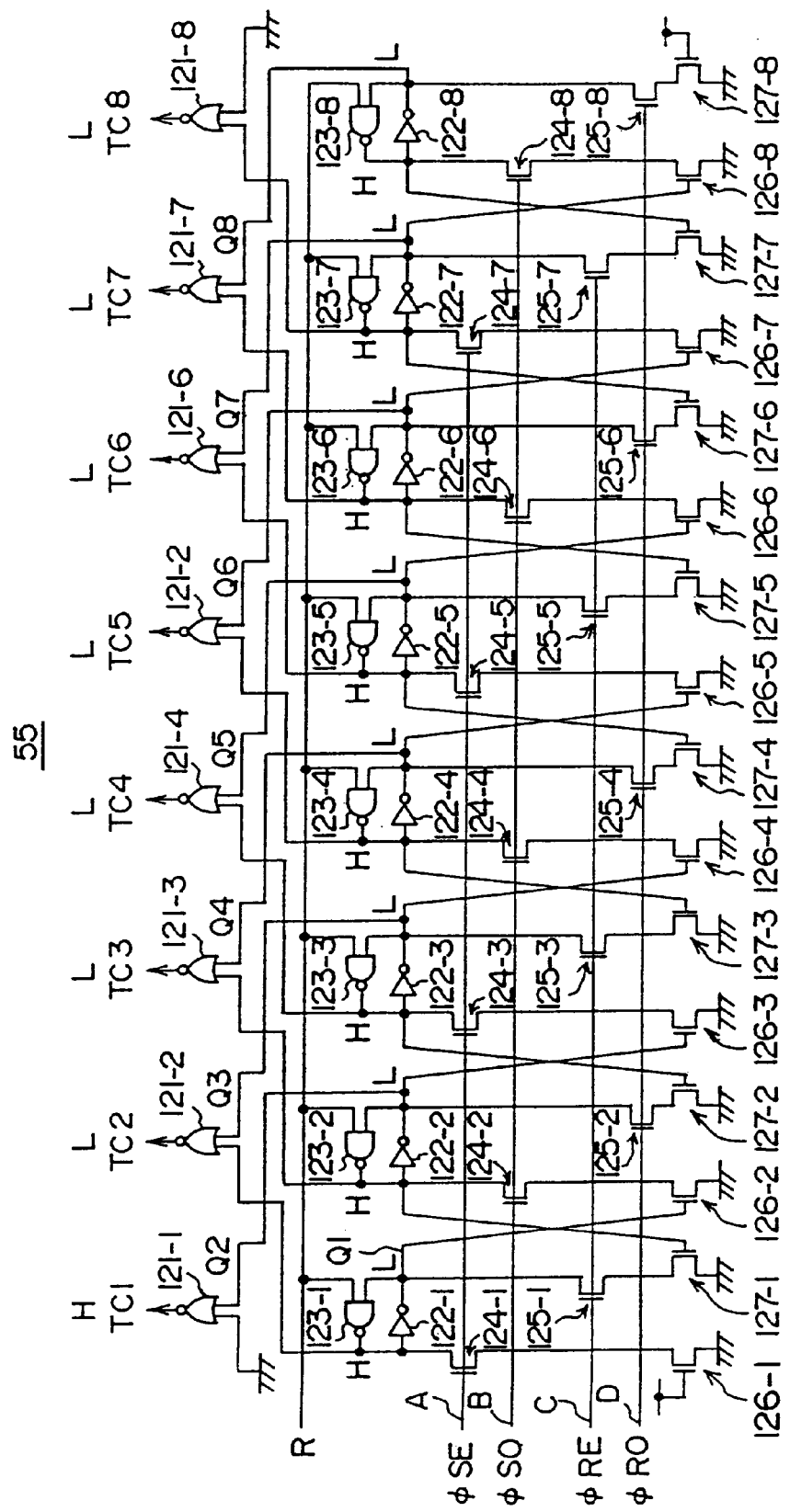
FIG. 6 is a circuit diagram of a delay-control circuit.

FIG. 6 is a circuit diagram of the delay-control circuit 55. The delay-control circuit 55 generates the control signals TC1 through TC8 described above.

The delay-control circuit 55 includes NOR circuits 121-1 through 121-8, inverters 122-1 through 122-8, NAND circuits 123-1 through 123-8, NMOS transistors 124-1 through 124-8, NMOS transistors 125-1 through 125-8, NMOS transistors 126-1 through 126-8, and NMOS transistors 127-1 through 127-8. When a reset signal R is turned to LOW, the delay-control circuit 55 is reset. Namely, when the reset signal R becomes LOW, outputs of the NAND circuits 123-1 through 123-8 become HIGH, and outputs of the inverters 122-1 through 122-8 become LOW. A pair of a given one of the NAND circuits 123-1 through 123-8 and a corresponding one of the inverters 122-1 through 122-8 forms a latch in which one element of the pair receives an output of the other element as an input. An initial state created by the reset signal R is thus kept even after the reset signal R returns to HIGH.

In this initial state, the output TC1 of the NOR circuit 121-1 is HIGH as shown in FIG. 6, and the remaining NOR circuits 121-2 through 121-8 have the outputs TC2 through TC8, respectively, which are LOW. That is, only the output TC1 is HIGH among the outputs TC1 through TC8.

When there is a need to increase the amount of delay with respect to a signal subjected to phase adjustment, HIGH pulses are supplied to signal lines A and B in turn. With a HIGH pulse of a signal ΦSE supplied to the signal line A, the NMOS transistor 124-1 is turned on. Since the NMOS transistor 126-1 is in a turned-on state, an output of the NAND circuit 123-1 is connected to the ground, and is forced to change from HIGH to LOW, so that an output of the inverter 122-1 becomes HIGH. This condition is latched by the latch comprising the NAND circuit 123-1 and the inverter 122-1. As a result, the output TC2 is changed from LOW to HIGH. In this condition, therefore, only the outputs TC1 and TC2 are HIGH.

With a HIGH pulse of a signal ΦSO supplied to the signal line B, the NMOS transistor 124-2 is turned on. Since the NMOS transistor 126-2 is already in a turned-on state, an output of the NAND circuit 123-2 is connected to the ground, and is forced to change from HIGH to LOW, so that an output of the inverter 122-2 becomes HIGH. This condition is latched by the latch comprising the NAND circuit 123-2 and the inverter 122-2. As a result, the output TC1 is changed from HIGH to LOW, while the output TC3 is turned from LOW to HIGH. In this condition, therefore, only the outputs TC2 and TC3 are HIGH.

As described above, HIGH pulses are supplied in turn to the signal lines A and B to shift a position to the right one by one when this position marks the only two HIGH outputs among the outputs TC1 through TC8.

When there is a need to decrease the delay amount, HIGH pulses are supplied to signal lines C and D in turn. Operations in this case are simply a reverse of the above-described operations, and a description thereof will be omitted.

The output signals TC1 through TC8 generated in this manner are supplied to the variable-delay circuit so as to adjust a delay of a signal when this signal is subjected to a phase adjustment.

Signals ΦSE, ΦSO, ΦRE, and ΦRO are supplied to the signal lines A through D. These signals ΦSE, ΦSO, ΦRE, and ΦRO are generated by the phase comparator 54 of FIG. 4.

Figure 7:
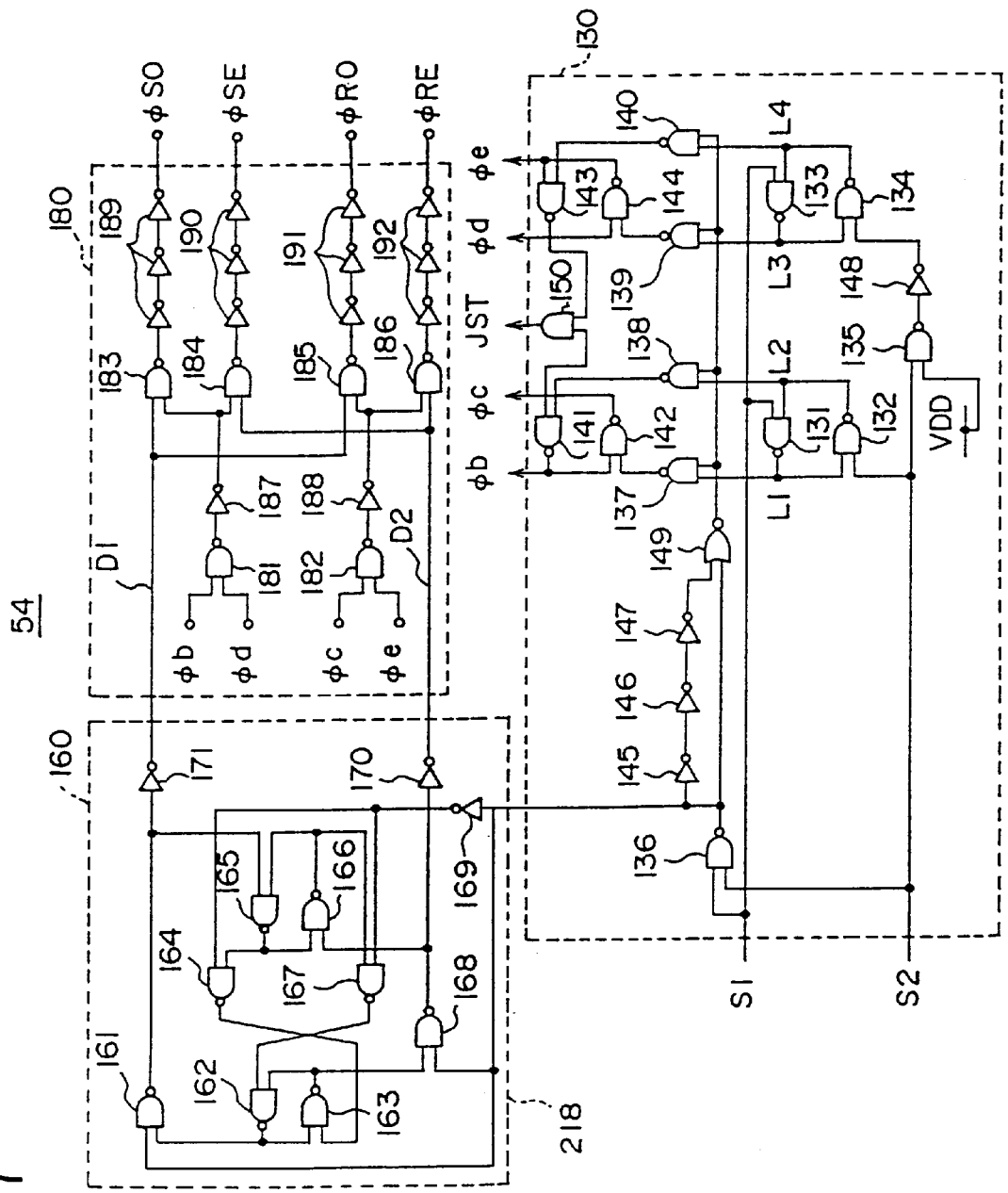
FIG. 7 is a circuit diagram showing a circuit configuration of a phase comparator.

FIG. 7 is a circuit diagram showing a circuit configuration of the phase comparator 54.

The phase comparator of FIG. 7 includes an edge-timing-comparison circuit 130, a binary counter 160, and a pulse-generation circuit 180.

The edge-timing-comparison circuit 130 includes NAND circuits 131 through 144, inverters 145 through 148, a NOR circuit 149, and an AND circuit 150. The binary counter 160 includes NAND circuits 161 through 168 and inverters 169 through 171. The pulse-generation circuit 180 includes NAND circuits 181 through 186 and inverters 187 through 192.

The edge-timing-comparison circuit 130 receives input signals S1 and S2, and determines which one of the input signals S1 and S2 has a rising edge ahead of the other. One of the input signals S1 and S2 corresponds to the dummy-clock signal d-i-clk, and the other corresponds to the clock signal i-clk.

If a rising edge of the input signal S1 is ahead of a rising edge of the input signal S2, a latch comprised of the NAND circuits 131 and 132 produces outputs L1 and L2 which are LOW and HIGH, respectively. Also, a latch formed by the NAND circuits 133 and 134 generates output L3 and L4 which are LOW and HIGH, respectively.

After this, both of the input signals S1 and S2 become HIGH, which changes an output of the NAND circuit 136 to LOW. This prompts the NOR circuit 149 to produce a HIGH output for a predetermined period of time. The HIGH output of the NOR circuit 149 opens gates of the NAND circuits 137 through 140, so that the latch outputs L1 through L4 are inverted and input to two latches comprised of NAND circuits 141 through 144. The latch comprised of NAND circuits 141 and 142 thus has outputs Φb and Φc which are HIGH and LOW, respectively. Also, the latch comprised of NAND circuits 143 and 144 has outputs Φd and Φe which are HIGH and LOW, respectively.

In this manner, when the input signal S1 has a rising edge ahead in time, the NAND circuit 181 of the pulse-generation circuit 180 changes an output thereof to LOW.

When a rising edge of the input signal S2 is ahead of a rising edge of the input signal S1 by a sufficient margin, the latch outputs Φb and Φc become LOW and HIGH, respectively, and, also, the latch outputs Φd and Φe become LOW and HIGH, respectively. In this case, therefore, the NAND circuit 182 of the pulse-generation circuit 180 changes an output thereof to LOW.

When a rising edge of the input signal S2 is ahead of a rising edge of the input signal S1 only by a small margin, the latch comprised of the NAND circuits 133 and 134 produces the outputs L3 and L4 which are LOW and HIGH, respectively, because of a signal delay introduced by the NAND circuit 135 and the inverter 148. In this case, the latch outputs Φb and Φc are LOW and HIGH, respectively, whereas the latch outputs Φd and Φe are HIGH and LOW, respectively. The NAND circuits 181 and 182 of the pulse-generation circuit 180 thus do not change outputs thereof, and these outputs remain at the HIGH level.

In this manner, when a difference in rising-edge timings is small between the input signal S1 and the input signal S2, i.e., when the rising edges can be regarded as having the same timing, the phase comparator of FIG. 7 does not generate an output.

The binary counter 160 divides a frequency of a signal by half when receiving the signal from the NAND circuit 136 of the edge-timing-comparison circuit 130. The binary counter 160 outputs a frequency-divided signal D1 from the inverter 171, and outputs a frequency-divided signal D2 from the inverter 170. The signal from the NAND circuit 136 has the same cycle as the input signals S1 and S2. Because of this, the frequency-divided signal D1 output from the binary counter 160 becomes HIGH during even-number cycles of the input signals, for example. In this case, the frequency-divided signal D2 becomes HIGH during odd-number cycles.

In the pulse-generation circuit 180, the output of the NAND circuit 181 becomes LOW when the input signal S1 is ahead of the input signal S2, as previously described. On the other hand, when the input signal S2 is ahead in time by a sufficient margin, the output of the NAND circuit 182 becomes LOW.

When the input signal S1 is ahead in time, the output of the NAND circuit 181 is inverted by the inverter 187, and is supplied to the NAND circuit 183 and 184 as a HIGH signal. The NAND circuit 183 further receives the frequency-divided signal D1, and the NAND circuit 184 further receives the frequency-divided signal D2. In this case, therefore, the pulse-generation circuit 180 generates HIGH pulses as the signal ΦSE or the signal ΦSO in turn When the input signal S2 is ahead in time by a sufficient margin, the output of the NAND circuit 182 is inverted by the inverter 188, and is supplied to the NAND circuit 185 and 186 as a HIGH signal. The NAND circuit 185 further receives the frequency-divided signal D1, and the NAND circuit 186 further receives the frequency-divided signal D2. In this case, therefore, the pulse-generation circuit 180 generates HIGH pulses as the signal ΦRO or the signal ΦRE in turn.

These signals ΦSE, ΦSO, ΦRE, and ΦRO are supplied to the delay-control circuit 55 shown in FIG. 6. In this manner, the delay of the variable-delay circuit of FIG. 5 can be controlled via the delay-control circuit 55 of FIG. 6, depending on which one of the signals S1 and S2 has a rising edge ahead of the other.

The DLL circuit described above can reliably establish synchronization with respect to the output data even under the presence of power-voltage fluctuation or the like. Namely, the output circuit 53 (the data buffer 600) has a timing thereof adjusted in an adaptable manner in response to the power-voltage fluctuation or the like. When a test on the DLL circuit is needed, therefore, the test should be carried out under such conditions as would be observed when the power-voltage fluctuation is present during a normal operation. As previously described, the data-bus switch 10 according to the present invention achieves appropriate conditions of the electric-current consumption as would be observed during the normal-operation mode while a test-operation mode is actually engaged.

An example of a test conducted on a DLL circuit includes checking how many clock cycles are necessary before the DLL circuit locks on when a clock cycle is input during the test. For this purpose, the DLL circuit is provided with a function to output a lock-on signal upon entering a lock-on state (upon stabilization of timings).

The AND circuit 150 of the edge-timing-comparison circuit 130 shown in FIG. 7 serves to output the lock-on signal JST. The AND circuit 150 receives the signals Φc and Φd as input signals. As previously described, the signals Φc and Φd become HIGH simultaneously when signals subjected to a phase comparison are ascertained as having the same timing. The lock-on signal JST thus becomes HIGH when the DLL circuit locks on, thereby informing of the lock-on status.

During a test on the DLL circuit, the lock-on signal JST, for example, is used as the test result TSRST shown in FIG. 2. In this manner, a check can be made outside the semiconductor device as to whether the DLL circuit has locked on and when the lock-on status was achieved. Further, use of the data-bus switch of the present invention makes it possible to obtain a proper test result under the same bus-operation condition (i.e, current-consumption condition) as would be observed during the normal-operation mode.

A plurality of DLL circuits may be used inside a semiconductor device for the purpose of stabilizing different timings.

Figure 8:
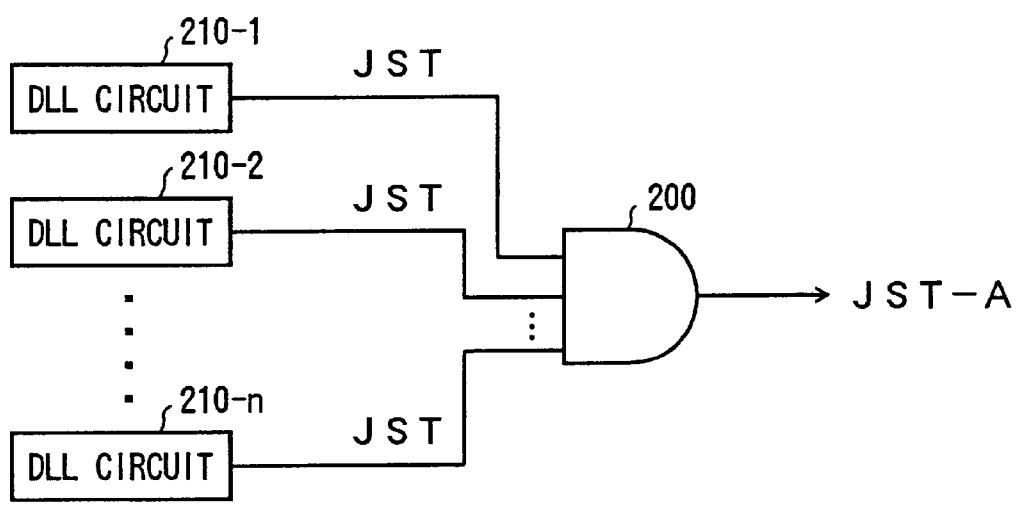
FIG. 8 is an illustrative drawing showing a configuration which generates a lock-on signal indicative of lock-on statuses of all DLL circuits.

FIG. 8 is an illustrative drawing showing a configuration which generates a lock-on signal JST-A indicative of lock-on statuses of all the DLL circuits.

As shown in FIG. 8, an AND circuit 200 receives lock-on signals from a plurality of DLL circuits 210-1 through 210-n, and performs an AND operation with respect to all the lock-on signals. An output of the AND circuit 200 is a lock-on signal JST-A, and this lock-on signal JST-A becomes HIGH when all the DLL circuits 210-1 through 210-n lock on.

In the same manner as previously described, the lock-on signal JST-A is output as the test result TSRST of the test-operation mode, thereby informing of whether all the DLL circuits have locked on and when such concurrent lock-on statuses was achieved. Further, use of the data-bus switch of the present invention makes it possible to obtain a proper test result under the same bus-operation condition (i.e, current-consumption condition) as would be observed during the normal-operation mode.

Further, the present invention is not limited to these embodiments, but various variations and modifications may be made without departing from the scope of the present invention.

What is claimed is:

1. A semiconductor device which outputs data from a plurality of data nodes during a normal-operation mode, and outputs a test result from at least one of said data nodes during a test-operation mode, said semiconductor device comprising:

a plurality of data-bus lines which convey said data with respect to said data nodes;

a data-bus switch which allows only the data-bus lines corresponding to said at least one of said data nodes to be driven in a first condition of said test-operation mode, and which allows all of said data-bus lines corresponding to said data nodes to be driven in a second condition of said test-operation mode.

2. The semiconductor device as claimed in claim 1, wherein a number of said data nodes used for outputting said data varies depending on an output-interface configuration set to said semiconductor device.

3. The semiconductor device as claimed in claim 2, wherein said at least one of said data nodes outputs said test result, and the data nodes other than said at least one of said data nodes output said data in said second condition of said test-operation mode.

4. The semiconductor device as claimed in claim 1, further comprising a memory-cell circuit, wherein said data output from said data nodes includes data stored in said memory-cell circuit.

5. The semiconductor device as claimed in claim 1, further comprising a timing-stabilization circuit which stabilizes a timing of a synchronization signal, wherein said test result includes a result of a test conducted on said timing-stabilization circuit.

6. The semiconductor device as claimed in claim 5, wherein said timing-stabilization circuit includes a circuit which generates a lock-on signal when a timing of said synchronization signal is stabilized, and wherein said test result includes said lock-on signal.

7. The semiconductor device as claimed in claim 1, further comprising a plurality of timing-stabilization circuits which stabilize timings of synchronization signals, wherein each of said plurality of said timing-stabilization circuits includes a circuit which generates a lock-on signal when a timing of a respective one of said synchronization signals is stabilized, said test result reflecting a status of said lock-on signal.

8. The semiconductor device as claimed in claim 1, wherein said at least one of said data nodes outputs said test result, and the data nodes other than said at least one of said data nodes output said data in said second condition of said test-operation mode.

9. A semiconductor device outputting data from a plurality of data nodes during a normal-operation mode, and outputting test data from at least one of said data nodes during a test mode, said semiconductor device comprising:

a plurality of data-bus lines, each operatively coupled to corresponding said data nodes;

a data-bus switch circuit connecting selected data-bus lines with corresponding said at least one of said data nodes in a first test mode, and connecting all of said data-bus lines with corresponding said data nodes in a second test mode.

* * * * *